United States Patent
Hasegawa

(10) Patent No.: US 7,061,290 B2
(45) Date of Patent: Jun. 13, 2006

(54) PLL CIRCUIT WITH SIMULATION COMPONENTS TO REDUCE PHASE OFFSET

(75) Inventor: Atsushi Hasegawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/963,718

(22) Filed: Oct. 14, 2004

(65) Prior Publication Data

US 2005/0083138 A1    Apr. 21, 2005

(30) Foreign Application Priority Data

Oct. 17, 2003    (JP)    ............................... 2003-357504

(51) Int. Cl.
*H03L 7/00*    (2006.01)

(52) U.S. Cl. ........................................ 327/157; 331/17

(58) Field of Classification Search ................ 327/157
See application file for complete search history.

(56) References Cited

U.S. PATENT DOCUMENTS

| | | | |
|---|---|---|---|
| 5,166,641 A * | 11/1992 | Davis et al. ................. | 331/1 A |
| 5,508,660 A | 4/1996 | Gersbach et al. ............. | 331/17 |
| 6,043,715 A * | 3/2000 | Bailey et al. .................. | 331/2 |
| 6,172,571 B1 * | 1/2001 | Moyal et al. .................. | 331/11 |
| 6,608,511 B1 * | 8/2003 | Hsu ........................... | 327/157 |

FOREIGN PATENT DOCUMENTS

| JP | 2002-232290 | 8/2002 |
|---|---|---|
| JP | 2003-188720 | 7/2003 |

* cited by examiner

*Primary Examiner*—Minh Nguyen
(74) *Attorney, Agent, or Firm*—McGinn IP Law Group, PLLC

(57) ABSTRACT

A PLL circuit in which a phase offset between a reference clock and a feedback clock is reduced. PLL circuit 10 includes a dummy phase comparator 16 that simulates a phase comparator 11 and has a pair of comparison inputs to which the reference clock is input, a dummy charge pump 17 that simulates a charge pump 12 and causes an output voltage thereof to rise or fall based on an up signal or a down signal output from the dummy phase comparator 16, and an amplifier 19 for detecting a difference between the output voltage of the charge pump 12 and the output voltage of the dummy charge pump 17. The PLL circuit controls the pulse widths of up and down signals of both of the phase comparator 11 and the dummy phase comparator 16 based on the output voltage of the amplifier 19.

20 Claims, 9 Drawing Sheets

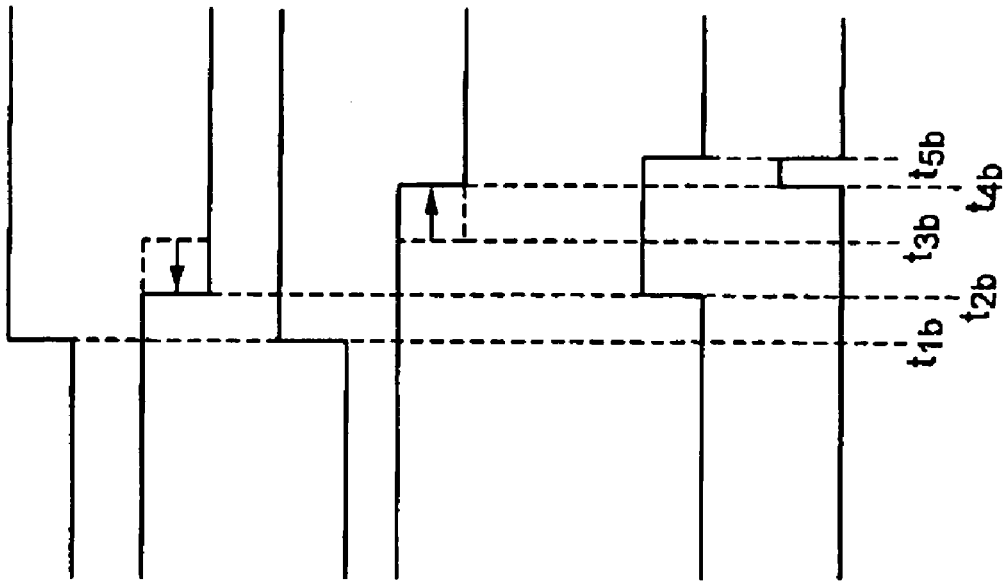
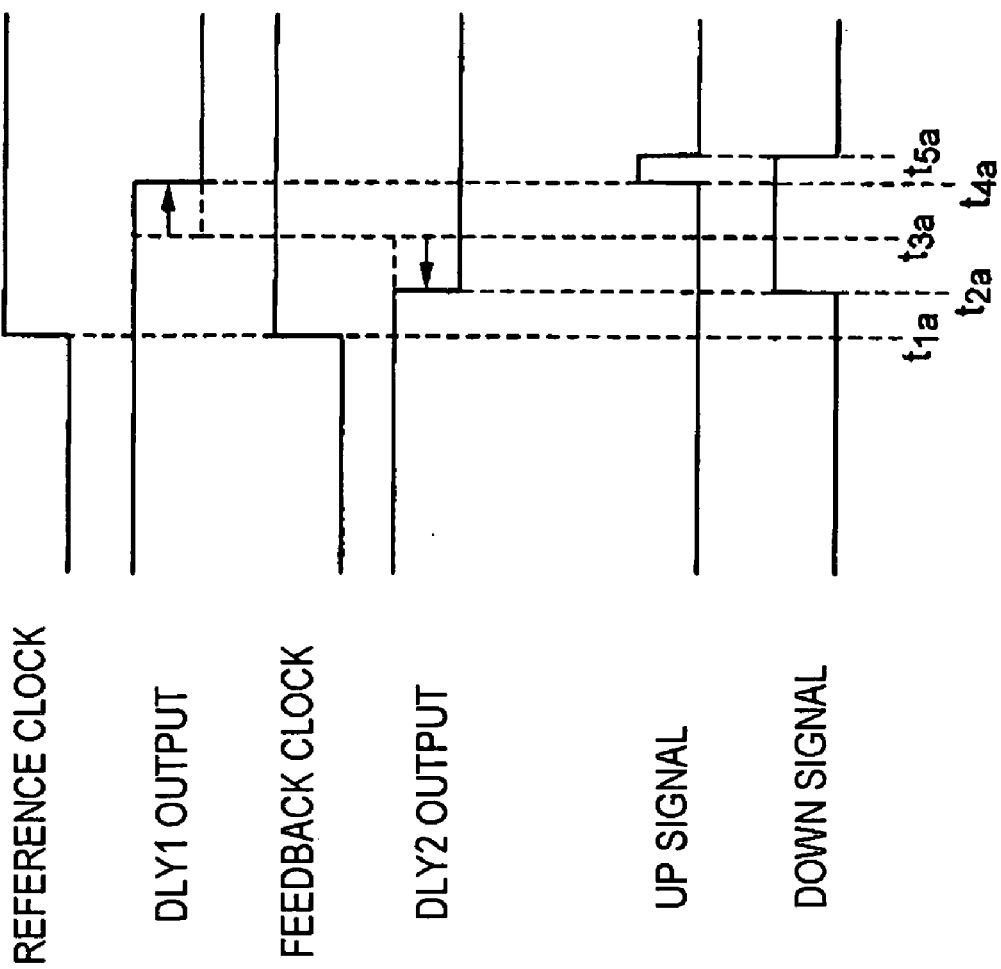
FIG. 4A
FIG. 4B

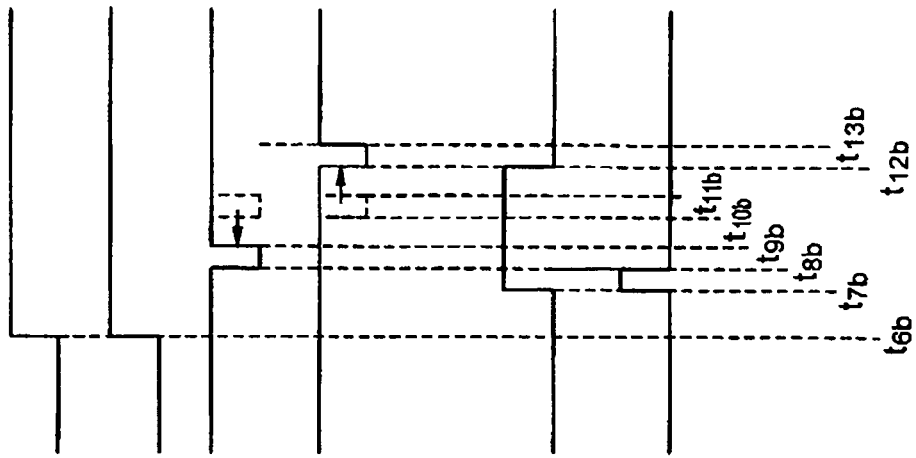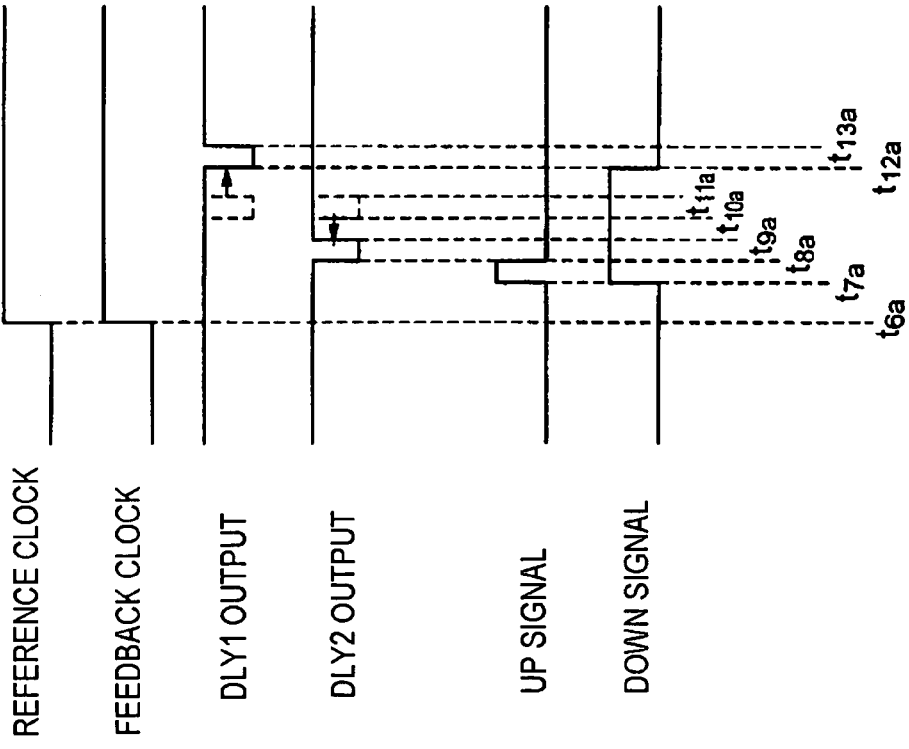

PLL CIRCUIT WITH SIMULATION COMPONENTS TO REDUCE PHASE OFFSET

FIELD OF THE INVENTION

The present invention relates to a PLL circuit. More specifically, the invention relates to a PLL circuit in which a phase offset between a reference clock signal and a feedback clock signal is reduced.

BACKGROUND OF THE INVENTION

PLL circuits are extensively used in various electronic circuits as the circuits for generating an internal clock signal synchronized with an input reference clock signal. FIG. 7 shows a conventional common PLL circuit using a block diagram. A PLL circuit 30 includes a phase comparator 31, a charge pump 32, a low-pass filter 33, and a voltage-controlled oscillator 34. By feed backing the output of the voltage-controlled oscillator 34 to the phase comparator 31, these are connected to a loop. The phase comparator 31 compares the phase of a reference clock signal RF_CLK with the phase of a feedback clock signal FB_CLK to each other, and generates an UP signal or a DOWN signal, which is a phase difference signal, based on the result of the comparison.

The charge pump 32 accumulates charge in an output node thereof based on the UP signal which is the output of the phase comparator 31, thereby raising its output voltage (output potential). Alternatively, the charge pump 32 discharges charge from the output node thereof based on the DOWN signal to drop its output voltage. The low-pass filter 33 removes high frequency components of the output voltage of the charge pump 32, for supply to the voltage-controlled oscillator 34. The voltage-controlled oscillator 34 generates a clock signal having a frequency dependent on an output voltage VC of the charge pump 33 received through the low-pass filter 33. The voltage-controlled oscillator 34 outputs the clock signal externally, and also supplies the clock signal to the phase comparator 31 as the feedback clock signal FB_CLK.

FIG. 8 shows a circuit example of the charge pump 32. The charge pump 32 includes an nMOS transistor MN4 through which a reference current flows from a current source not shown and current mirror circuits constituted from nMOS transistors MN3 and MN1 and pMOS transistors MP1 and MP3. The nMOS transistors MN3 and MN1 mirror-reflect the reference current that flows through this nMOS transistor MN4. The pMOS transistor MP3 is connected in series with the nMOS transistor MN3. The pMOS transistor MP1 mirror-reflects the current that flows through this pMOS transistor MP3. The pMOS transistor MP2 inputs the UP signal at a gate thereof, and charges the output node of the charge pump 32 by the reference current output from the pMOS transistor MP1 during a period in which the UP signal at a low level continues to be output. The nMOS transistor MN2 inputs the DOWN signal at a gate thereof and discharges charge from the output node of the charge pump by the reference current output from the nMOS transistor MN1 during a period in which the DOWN signal at a high level continues to be output.

In the PLL circuit 30 described above, when the phases of the reference clock signal RF_CLK and the feedback clock signal FB_CLK are locked, the phase comparator 31 outputs the UP signal at the low level and the DOWN signal at the high level for a same period, respectively, balances the amount of charge for charging the output node with the amount of charge extracted from the output node, and thereby maintains the output voltage VC of the charge pump at a constant value.

Depending on the output voltage VC of the charged pump, a mirror ratio between the pMOS transistor MP1 and the nMOS transistor MN1 of the current mirror circuit sometimes becomes out of balance, and the transistors MP1 and MN1 might have different current driving capabilities. In this case, even if the pulse width of the UP signal is the same as the pulse width of the DOWN signal, the amount of charge for charging the output node of the charge pump becomes different from the amount of charge extracted from the output node. As a result, the output voltage VC of the charge pump varies. In order to maintain the output voltage VC to be constant in such a condition, it is necessary to give an offset between the UP signal and the DOWN signal, thereby equating the amounts of charges for charging and extraction. However, the offset given between the UP signal and the DOWN signal makes it presence as the offset of phases of the signals input to the two inputs of the phase comparator for comparison. In other words, the unbalance that occurs in the charge pump makes its presence as the phase offset between the reference clock signal and the feedback clock signal i.e., an output clock signal, as seen from the outside of the PLL circuit, and this is not desirable.

In order to adjust the unbalance described above, various circuit configurations have been proposed up to now. FIG. 9 shows a charge pump that has adopted a typical approach to adjusting the unbalance, shown in Patent Document 1. In this example, a pMOS transistor MP13 and an nMOS transistor MN13 that have the same size as the pMOS transistor MP1 and the nMOS transistor MN1, respectively, are prepared for, and these, the pMOS transistor MP1, and the nMOS transistor MN1 constitute current mirror circuits. The drain of the transistor MP13 and the drain of the transistor MN13 are connected to each other. A potential VCDM at the node connecting the transistors MP13 and MN13 is compared with an output potential VC of the charge pump by an operational amplifier 35, and the output voltage of the operational amplifier 35 is supplied to the gates of a pMOS transistor MP16 and an nMOS transistor MN16 of which their drains are connected to each other.

In a charge pump circuit described in the above Patent Document 1, the transistors MP13, MN13, MP16, and MN16, transistors MP15 and MN15, and the operational amplifier 35 constitute a feedback circuit. The operational amplifier 35 performs control so that the potential VCDM is the same as the potential VC. Further, the transistors MP16 and MP15 and the transistors MN16 and MN15 constitute source follower circuits, respectively.

If a difference between the amounts of charges that flow through the transistor MP13 and the transistor MN13 is produced and the unbalance is caused, the potential VCDM varies. Thus, currents flow from the source follower circuits so that this unbalance is counteracted. The currents that have flown also flow through transistors MP2 and MN2 that constitute the main charge pump, through current mirror circuits constituted from the transistor MP15 and a transistor MP14 and from the transistor MN15 and a transistor MN14, thereby adjusting the output potential VC of the charge pump. With this arrangement, like the unbalance caused between the transistors MP13 and MN13, the unbalance that would be also produced between the transistors MP1 and MN1 that constitute the main charge pump is counteracted.

[Patent Document 1] U.S. Pat. No. 5,508,660

SUMMARY OF THE DISCLOSURE

In the charge pump circuit described in the above Patent Document 1, it is possible to adjust the unbalance between the transistors MP1 and MN1 produced in the form of a DC, caused by the output potential VC. However, in an operating condition in particular in which the transistors MP2 and MN2 are turned on and off only during a short period when the charge pump is actually used, the unbalance that will be described hereinafter is produced. Thus, the effect of reducing the phase offset between input clocks to the phase comparator is restricted.

To take an example, even if the pulse widths of the UP signal and the DOWN signal are the same, a difference is generated between the period during which the output node of the charge pump is charged with charge and the period during which charge is extracted from the output node, due to a difference between the switching speeds of the transistors MP2 and MN2. As a result, the offset is generated. Further, the potential VC at the output node of the charge pump varies due to coming and going of charge from and to the parasitic capacitances between gates and sources, associated with turning on and off of the transistors MP2 and MN2. Further, even by a difference among the current driving capabilities of the transistors inside the phase comparator as well, the unbalance is produced. Like the unbalance in the form of the DC, which makes it presence at the output potential VC, these produce the phase offset. Especially when the operation speed is increased, its influence becomes manifest.

In view of the problems encountered by the conventional PLL circuit described above, an object of the present invention is to provide a PLL circuit in which a phase offset caused by a difference in the current driving capability of a charge pump and a phase offset caused by an unbalance among circuit elements in a phase comparator and the PLL circuit can be reduced.

In order to achieve the above object, in a PLL circuit of the present invention including: a phase comparator for mutually comparing phases of a reference clock signal and a feedback clock signal input to a pair of inputs for comparison thereof and outputting an up signal or a down signal based on a result of the comparison; a charge pump for causing an output voltage thereof to rise or fall based on the up signal or the down signal output by the phase comparator; a low-pass filter for filtering the output voltage of the charge pump; and a voltage-controlled oscillator for generating a clock signal dependent on the output voltage of the low-pass filter and supplying the generated clock signal to the phase comparator as the feedback clock signal; wherein the PLL circuit comprises: a dummy phase comparator simulating the phase comparator, for mutually comparing phases of a predetermined clock signal input to a pair of inputs for comparison thereof connected in common and outputting an up signal or a down signal according to a result of the comparison; a dummy charge pump simulating the charge pump, for causing an output voltage thereof to rise or fall based on the up signal or the down signal output by the dummy phase comparator; and an amplifier for detecting a difference between the output voltage of the dummy charge pump and the output voltage of the charge pump; and at least one of pulse widths of each of the up and down signals of the phase comparator and the dummy phase comparator is controlled based on the output voltage of the amplifier.

In the PLL circuit of the present invention, the predetermined clock signal is input to the pair of inputs for comparison of the dummy phase comparator for simulating the phase comparator constituting a loop. If any unbalance is caused in the dummy phase comparator or the dummy charge pump, the amount of charge for charging the output node of the dummy charge pump becomes unbalanced with the amount of charge extracted from the output node, so that the output voltage of the dummy charge pump rises or falls. In this case, the output voltage of the amplifier varies. Thus, by controlling at least one of the pulse widths of the up and down signals of the dummy phase comparator based on the variations of the voltage, the output voltage of the dummy charge pump that has risen or fallen is corrected. On this occasion, the phase comparator constituting the loop is also controlled in the same manner. Thus, an unbalance in the charge pump constituting the loop, which is anticipated to be the same as the unbalance in the dummy charge pump, is corrected.

The term "simulate" used in the present invention means to have a configuration that performs precisely identical operations or generates the same output when the same input is supplied to both of simulating and simulated elements. Typically, for both of the simulating and simulated elements, the same circuit configuration is adopted, and circuit elements of the same size are employed. To take an example, the phase comparator and the dummy phase comparator are designed with the same design and simultaneously formed on the same substrate and with the same process. It can thereby be expected that if an unbalance is present in the phase comparator, the same unbalance is also present in the dummy phase comparator.

In the PLL circuit in a preferred mode of the present invention, each of the phase comparator and the dummy phase comparator includes voltage-controlled delay elements of which amounts of delay are controlled based on the output voltage of the amplifier. The voltage-controlled delay elements control the pulse widths of the up and down signals output by the phase comparator and the dummy phase comparator.

By using the voltage-controlled delay elements, the pulse widths of the up and down signals can be easily controlled, based on the output of the amplifier. By controlling the amounts of delay of the signals input to the pair of inputs for comparison of the phase comparator and the dummy phase comparator by the voltage-controlled delay elements, the pulse widths of the up and down signals, which are the outputs of the phase comparator, can be controlled.

In another preferred mode of the present invention, each of the phase comparator and the dummy phase comparator includes voltage-controlled delay elements of which amounts of delay are controlled based on the output voltage of the amplifier, and the voltage-controlled delay elements control timings of the up and down signals output by the phase comparator and the dummy phase comparator. In this case, the voltage-controlled delay elements control timings of causing the up and down signals to fall or rise.

Though any signal may be used as the predetermined clock signal, the reference clock signal, for example, is a stable signal. Thus, it is preferable that this is used as the predetermined signal.

The meritorious effects of the present invention are summarized as follows.

According to the PLL circuit of the present invention, not only an unbalance caused by a difference in the current driving capability of the charge pump, but also other unbalance within the charge pump and a phase offset caused by an unbalance in the phase comparator can be reduced. Thus, an output clock signal having a phase well aligned with the phase of the reference clock signal can be generated.

BRIEF DESCRIPTION OF THE DRAWINGS

FIGS. 4A and 4B show timing diagrams for showing operations of the first embodiment.

FIGS. 6A and 6B show timing diagrams showing operations of the second embodiment.

PREFERRED EMBODIMENTS OF THE INVENTION

Figure 1:
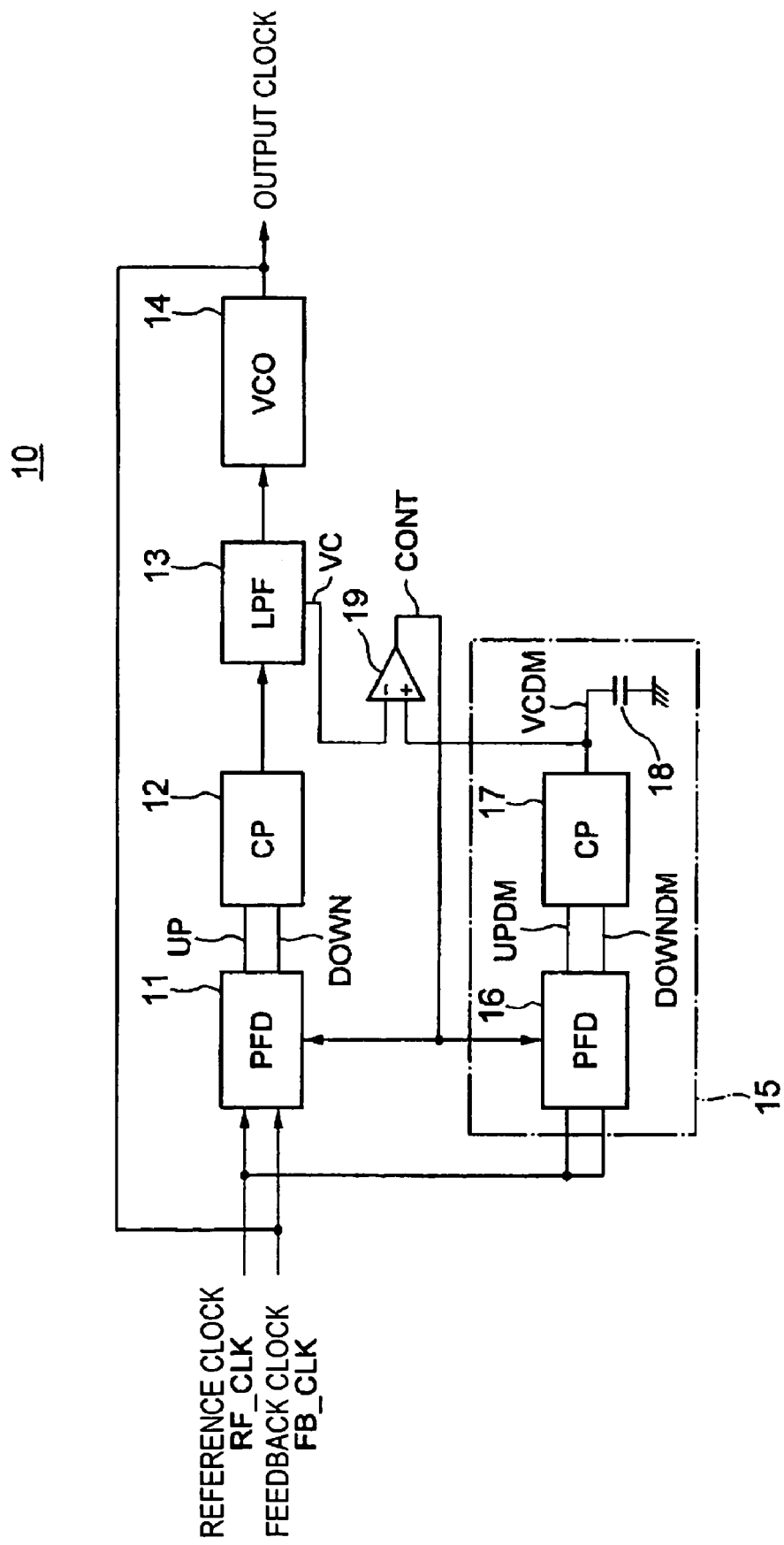
FIG. 1 is a block diagram of a PLL circuit according to an embodiment of the present invention.

The present invention will be further described below, based on the embodiments thereof, with reference to the appended drawings. FIG. 1 shows a configuration of a PLL circuit according to a first embodiment of the present invention. A PLL circuit 10 includes a phase comparator 11, a charge pump 12, a low-pass filter 13, and a voltage-controlled oscillator 14 that constitutes the same loop as in the prior art, an unbalance adjusting circuit block 15, and an operational amplifier 19 for comparing the output voltage of the loss pass filter 13 that constitutes the loop with the output voltage of the unbalance adjusting circuit block 15 to generate a control voltage signal CONT.

The unbalance adjusting circuit block 15 includes a dummy phase comparator 16 and a dummy charge pump 17, and a capacitor 18 for removing high frequency components from the output voltage VCDM of the dummy charge pump 17. By having same circuit configurations and device dimensions as the phase comparator 11 and the charge pump 12, respectively, which constitute the loop, the dummy phase comparator 16 and the dummy charge pump 17 simulate these.

Figure 2:
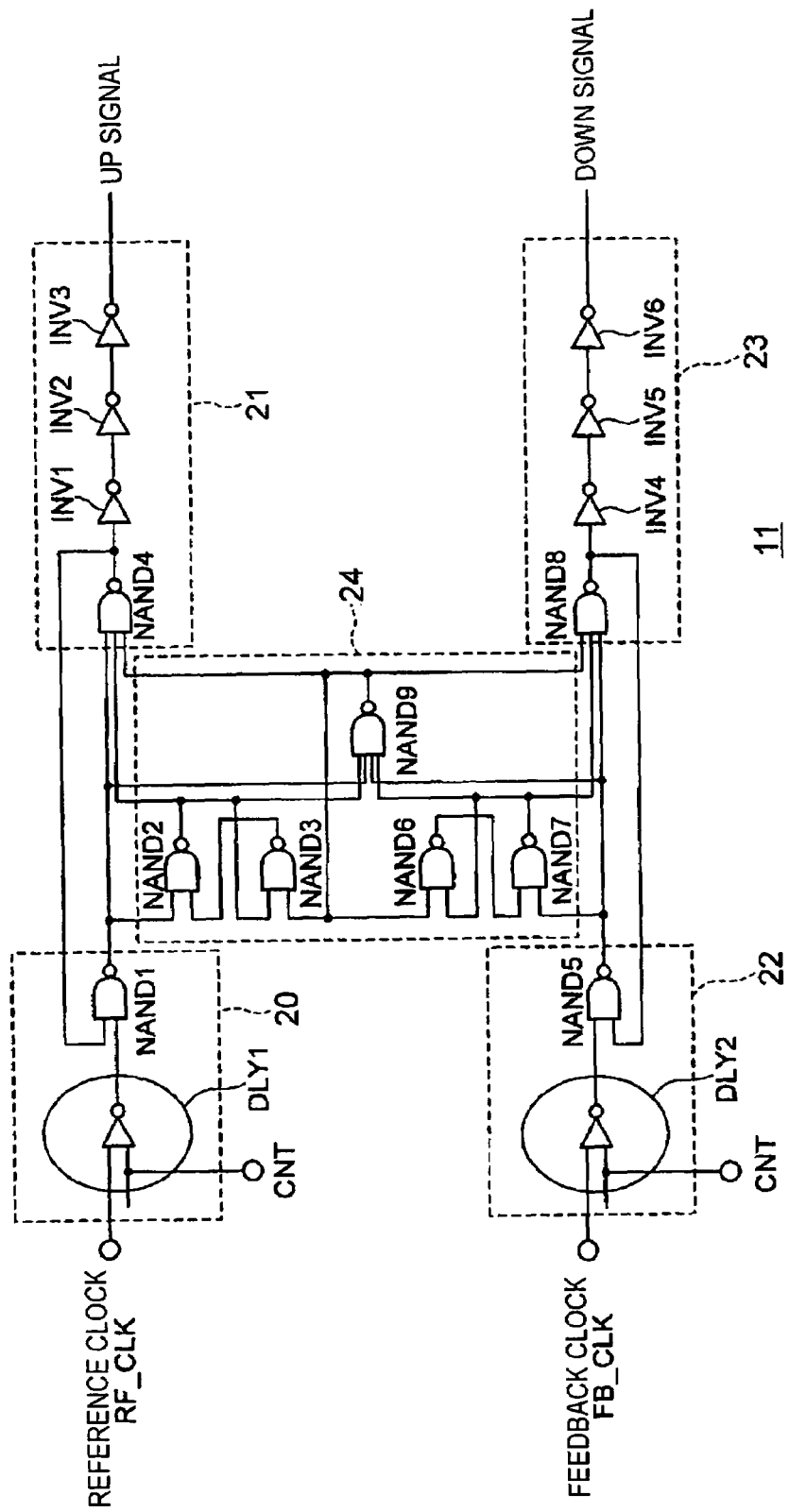
FIG. 2 is a logic circuit diagram of a phase comparator in FIG. 1.

FIG. 2 is a logic circuit diagram showing a configuration of the phase comparator 11. The dummy phase comparator 16 has the same circuit configuration and the same device dimensions as the phase comparator 11, except that both inputs for comparison are connected in common and a reference clock signal RF_CLK is input to the inputs for comparison. The respective phase comparators 11 and 16 include voltage-controlled delay elements DLY1 and DLY2, respectively, at the input stages of both of the inputs for comparison. Delay times of the voltage-controlled delay elements DLY1 and DLY2 are controlled by the output voltage CONT of the operational amplifier 19.

The phase comparator 11 includes a reference clock signal input unit 20, an UP signal generating unit 21, a feedback clock signal input unit 22, a DOWN signal generating unit 23, and a reset signal generating unit 24. The reference clock signal input unit 20 includes the voltage-controlled delay element DLY1 to which the reference clock signal RF_CLK is input and a NAND gate (NAND1), to one input of which the output of the voltage-controlled delay element DLY1 is coupled. The UP signal generating unit 21 includes a NAND 4 having three inputs, to one of which the output of the NAND1 is coupled, and three inverters (INV1 to INV3) connected in cascade for transmitting the output of the NAND4. The feedback clock signal input unit 22 includes the voltage-controlled delay element DLY2 to which a feedback clock signal FB_CLK is input and a NAND 5 with the output of the voltage-controlled delay element DLY2 connected to one of inputs thereof. The DOWN signal generating unit 23 includes a NAND8 with the output of the NAND 5 connected to one of the three inputs thereof and three inverters (INV4 to INV6) connected in cascade for transmitting the output of the NAND8. The reset signal generating unit 24 generates a reset signal for resetting the UP signal and the DOWN signal based on the signals input from both of the clock signal input units 20 and 22. The output of the NAND4 is connected to the other input of the NAND1, and the output of the NAND8 is connected to the other input of the NAND5.

The reset signal generating unit 24 includes a NAND2, a NAND3, a NAND7, a NAND6, and a NAND9. The output of the NAND1 is connected to one input of the NAND2. The output of the NAND2 is connected to one input of the NAND3. The output of the NAND5 is connected to one input of the NAND7. The output of the NAND7 is connected to one input of the NAND6. The NAND9 has four inputs to which the outputs of the NAND1, NAND2, NAND5, and NAND7 are connected. The output of the NAND3 is connected to the other input of the NAND2. The output of the NAND6 is connected to the other input of the NAND7. The output of the NAND2 is connected to the other one of the three inputs of the NAND4. Likewise, the output of the NAND7 is also connected to the other one of the three inputs of the NAND8. The output of the NAND9 is connected to the remainder inputs of the NAND4 and NAND8 and the other inputs of the NAND3 and the NAND6.

Figure 3:
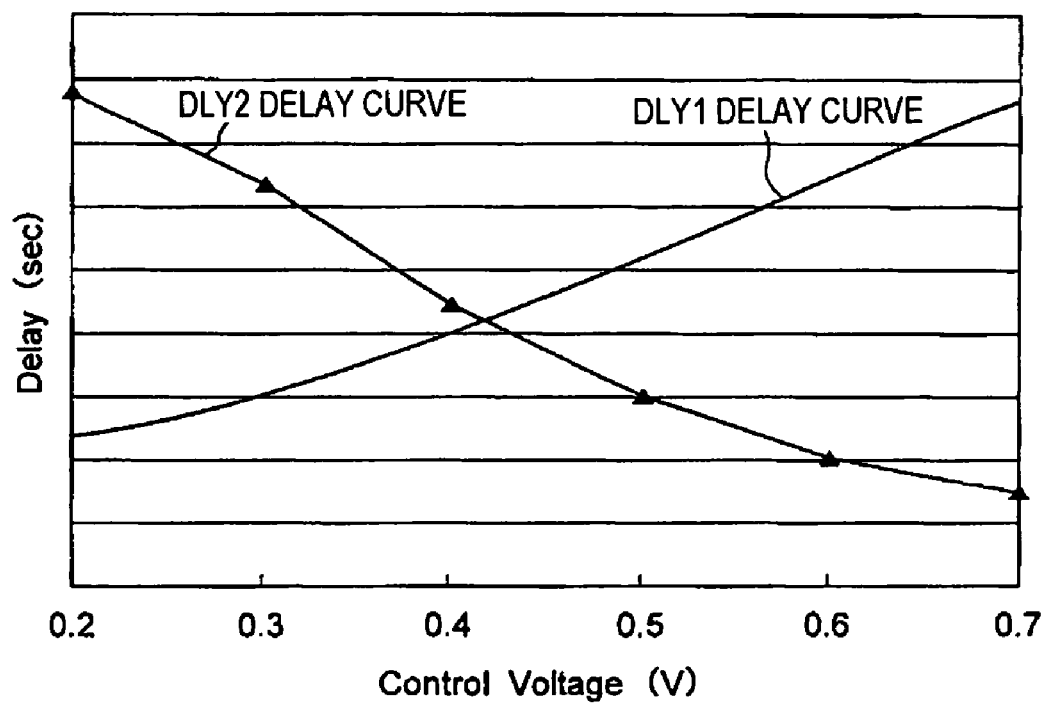
FIG. 3 is a graph showing characteristics of voltage-controlled delay elements.

FIG. 3 illustrates control characteristics of the voltage-controlled delay elements DLY1 and DLY2. The delay time of the voltage-controlled delay element DLY1 connected to the reference clock signal input of the phase comparator 11 and the corresponding input of the dummy phase comparator 16 for comparison increases with a rise in the control voltage (CONT). The delay time of the voltage-controlled delay element DLY2 connected to the feedback clock signal input of the phase comparator 11 and the corresponding input of the dummy phase comparator for comparison decreases with a rise in the control voltage. Both of the voltage-controlled delay elements DLY1 and DLY2 have the same delay time at a position where the control voltage is around 0.4 V.

FIGS. 4A and 4B respectively show a timing chart of signals in respective units in the phase comparator 11 when the charge charging capabilities of the charge pumps 12 and 17 are higher than their charge extracting capabilities (when the driving capabilities on their UP sides are higher) and a timing chart of the signals in the respective units in the phase comparator 11 when the charge extracting capabilities of the charge pumps 12 and 17 are higher than their charge charging capabilities (when the driving capabilities on their DOWN sides are higher). Both of the diagrams show the case where the reference clock signal is locked with the feedback clock signal.

Referring to FIG. 4A, when both of the reference clock signal and the feedback clock signal are at a low level, the outputs of the voltage-controlled delay elements DLY1 and DLY2 are both at a high level, the reset signal (not shown), which is the output of the NAND9 of the reset signal generating unit 24 is at the high level, and the UP signal and the DOWN signal are both at the low level. When the driving capability on the UP side of the dummy charge pump 17 is high, the output voltage CONT of the operational amplifier 19 becomes high. Thus, the delay time of the voltage-controlled delay element DLY1 is large, while the delay time of the voltage-controlled delay element DLY2 is small. For this reason, when both of the reference clock signal and the feedback clock signal rise to the high level (at t1a), the output of the voltage-controlled delay element DLY2 goes low earlier (at t2a). In response to this, the output of the NAND5 goes high, and the output of the NAND8 goes low. Thus, the DOWN signal, which is the output of the INV6 rises earlier. For facilitating understanding, the outputs of the voltage-controlled delay elements DLY1 and DLY2 when the driving capabilities on the UP side and the DOWN side are equal are indicated by broken lines. It is shown that the outputs of the voltage-controlled delay elements DLY1 and DLY2 fall at a time t3a.

Next, the output of the voltage-controlled delay element DLY1 goes low (at t4a), and in response to this, the output of the NAND1 goes high and the output of the NAND4 goes low. Thus, the UP signal, which is the output of the INV3 rises. At this point, the inputs to the NAND9 of the reset signal generating unit 24 all go high temporarily. Thus, the reset signal at the low level is output from the NAND9, so that the UP signal and the DOWN signal go low again (at t5a). After this reset signal is output, the inputs to the NAND9 go low again by the operations of the NAND2, NAND3, NAND6, and NAND7. The reset signal is therefore a one-shot pulse that disappears in a short time. When the reset signal is generated, the outputs of the NAND2 and the NAND7 input to the three-input NAND4 and NAND8, respectively, go low. Then, even if the reset signal recovers, the UP signal and the DOWN signal keep low.

As described above, in this embodiment, the delay times of the voltage-controlled delay elements DLY1 and DLY2 are adjusted based on the output voltage CONT of the operational amplifier 19 that monitors the output potential of the dummy charge pump 17. With this arrangement, when the driving capabilities on the UP sides are high, the UP signals are raised later, and their pulse widths are reduced. Further, the DOWN signals are raised earlier, and their pulse widths are increased. A potential at the output node at which an increase in the potential has been observed of the dummy charge pump 17 is thereby corrected. A phase offset between the reference clock signal and the feedback clock signal, caused by the high driving capabilities on the UP sides is thereby compensated for. Incidentally, adjustment of the pulse widths may be performed on either of the UP signals and the DOWN signals.

Referring to FIG. 4B, when the driving capability on the DOWN side of the dummy charge pump 17 is high, the output voltage CONT of the operational amplifier 19 becomes low. Thus, the delay time of the voltage-controlled delay element DLY1 decreases, and the delay time of the voltage-controlled delay element DLY2 increases. For this reason, when both of the reference clock signal and the feedback clock signal rise to the high level (at t1b), the output of the voltage-controlled delay element DLY1 goes low earlier (t2b). In response to this, the output of the NAND1 goes high, so that the output of the NAND4 goes low. Thus, the UP signal, which is the output of the INV3 rises earlier.

Next, the output of the voltage-controlled delay element DLY2 falls to the low level (at t4b). In response to this, the output of the NAND5 goes high, so that the output of the NAND8 goes low. Thus, the DOWN signal, which is the output of the INV6, rises. At this point, all the inputs to the NAND9 in the reset signal generating unit 24 temporarily go high. Thus, the reset signal at the low level is output from the NAND9, so that the UP signal and the DOWN signal go low again (at t5b). After this reset signal is output, the inputs to the NAND9 go low again by the operations of the NAND2, NAND3, NAND6, and NAND7. Thus, the reset signal disappears in a short time. Incidentally, the time t3b is the same as the time t3a.

As described above, in this embodiment, when the driving capabilities on the DOWN sides are high, the UP signals are raised earlier, and their pulse widths are increased. Further, by raising the DOWN signal later and reducing their pulse widths, a potential at the output node of the dummy charge pump 17, of said potential reduction having been observed, is corrected. With this arrangement, a phase offset between the reference clock signal and the feedback clock signal caused by the high driving capabilities on the DOWN sides is compensated for. Incidentally, adjustment of the pulse widths may be performed on either of the UP signals and the DOWN signals.

Figure 5:
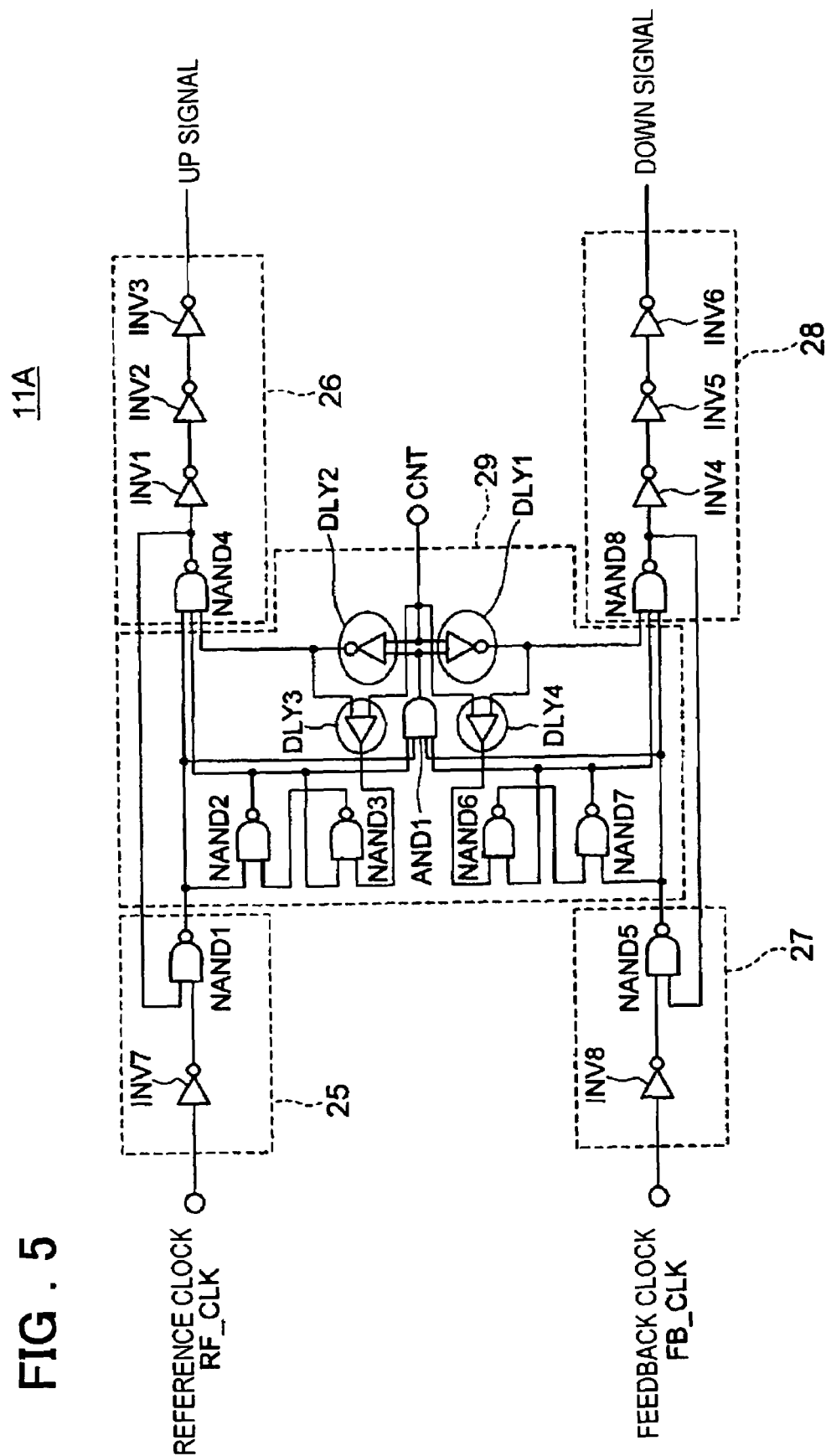
FIG. 5 is a logic circuit diagram of a phase comparator used in a PLL circuit according to a second embodiment of the present invention.
Figure 7:
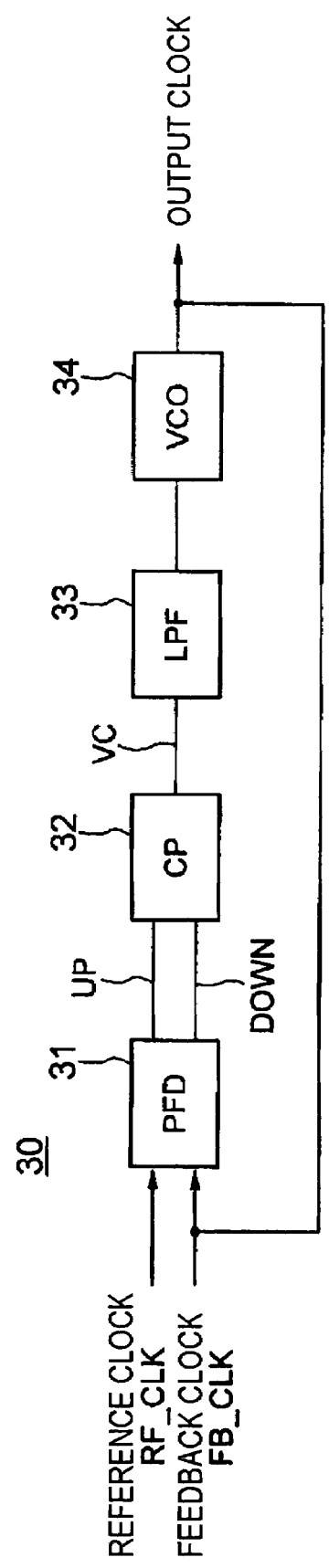
FIG. 7 is a block diagram of a conventional common PLL circuit.
Figure 8:
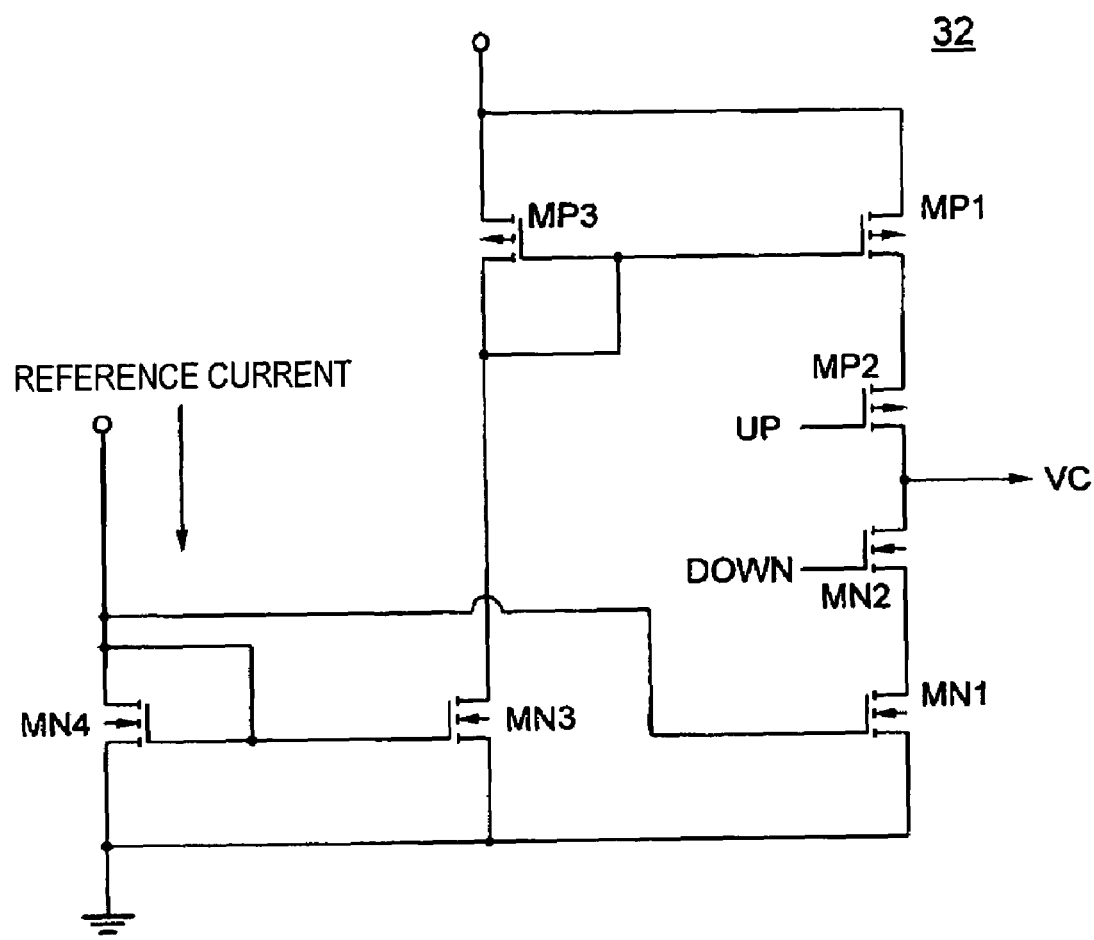
FIG. 8 is a circuit diagram of a charge pump shown in FIG. 7.
Figure 9:
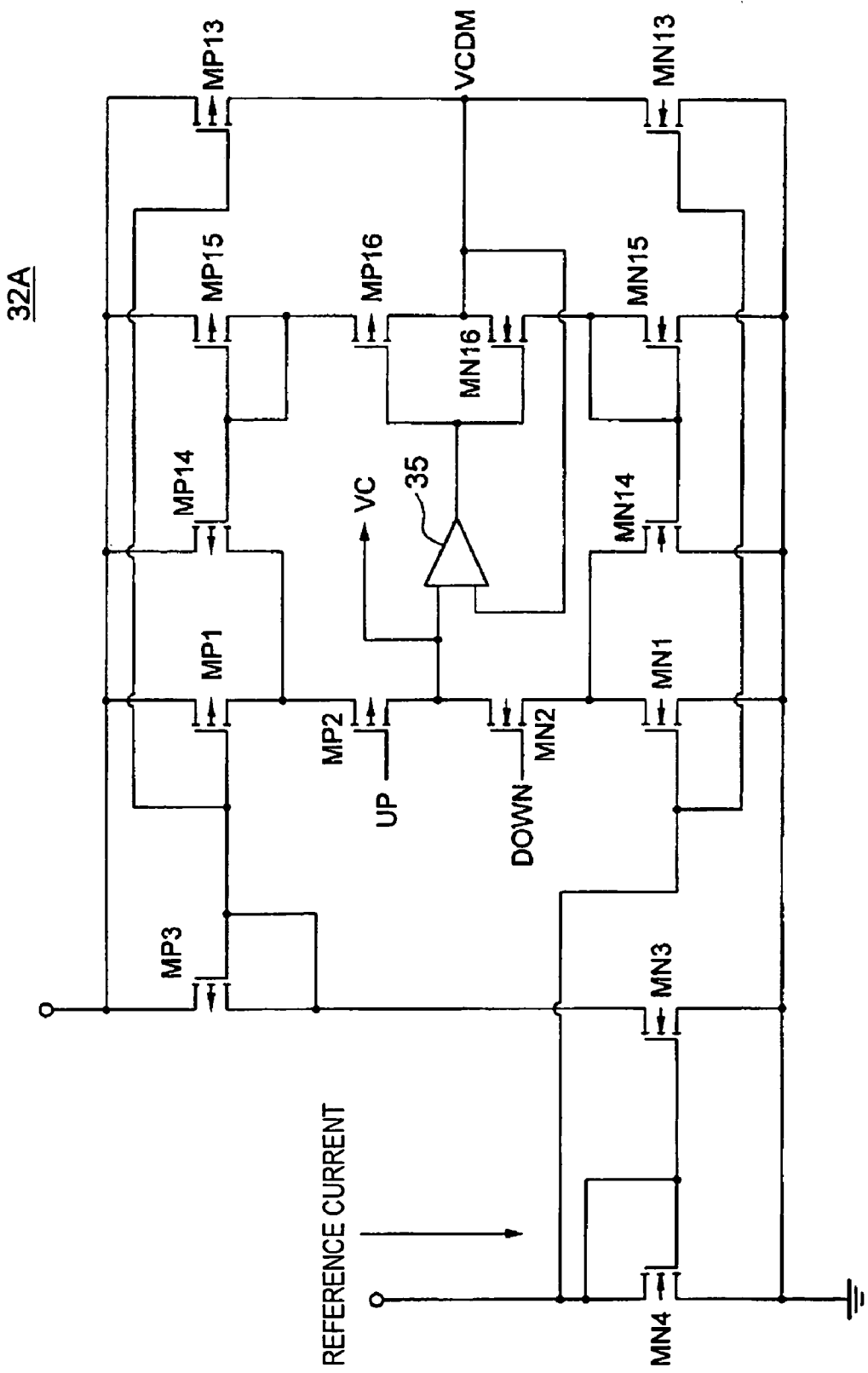
FIG. 9 is a circuit diagram of a charge pump described in Patent Document 1.

FIG. 5 shows a configuration of a phase comparator 11A of a PLL circuit according to a second embodiment of the present invention. The PLL circuit in this embodiment has the same configuration as the PLL circuit shown in FIG. 1, except for the configurations of the phase comparator and the dummy phase comparator. The dummy phase comparator in this embodiment has the same configuration as the phase comparator 11A shown in FIG. 5, except that a pair of inputs for comparison is connected in common and the reference clock signal is input to the inputs for comparison.

The phase comparator 11A includes a reference clock signal input unit 25 for inputting the reference clock signal, an UP signal generating unit 26 for generating the UP signal, a feedback clock signal input unit 27 for inputting the feedback clock signal, a DOWN signal generating unit 28 for generating the DOWN signal, and a reset signal generating unit 29 for generating the reset signal.

The reference clock signal input unit 25 has an inverter INV7 in place of the voltage-controlled delay element DLY1 in the reference clock signal input unit 20 shown in the first embodiment. Other configurations of the reference clock signal input unit 25 are the same as those of the reference clock signal input unit 20 described before. Likewise, the feedback clock signal input unit 27 includes an inverter 8 in place of the voltage-controlled delay element DLY2 in the feedback clock signal input unit 22 shown in the first embodiment. Other configurations are the same as those of the feedback clock signal input unit 22 described before. Referring to FIG. 5, same reference characters are assigned to the elements that are the same as those of the phase comparator in FIG. 2.

The UP signal generating unit 26 and the DOWN signal generating unit 28 have the same configurations of the UP signal generating unit 21 and the DOWN signal generating unit 24 in the first embodiment, respectively. The reset signal generating unit 29 has the same configuration as the reset signal generating unit 24 in the first embodiment, except that an AND1 is included in place of the NAND9 in the reset signal generating unit 24 shown in the first embodiment, the voltage-controlled delay elements DLY2 and DLY1 are connected between the output of the AND1 and the input of the NAND4 and the output of the AND1 and the input of the NAND8, respectively, buffer type (positive logic) voltage-controlled delay elements DLY3 and DLY4 are connected between the output of the voltage-controlled delay element DLY2 and the input of the NAND3 and the output of the voltage-controlled delay element DLY1 and the input of the NAND6, respectively. The voltage-controlled delay elements DLY1 and DLY2 both have delay characteristics described with reference to FIG. 3. Further, the voltage-controlled delay element DLY3 has the same delay characteristic as the voltage-controlled delay element DLY1, while the voltage-controlled delay element DLY4 has the same delay characteristic as the voltage-controlled delay element DLY2.

FIGS. 6A and 6B show signals at respective units of the phase comparator 11A in this embodiment in the same manner as FIGS. 4A and 4B. Referring to FIG. 6A, when the reference clock signal and the feedback clock signal are both at the low level, the outputs of the inverters INV7 and INV8 are both at the high level. Respective reset signals (not shown), which are the outputs of the voltage-controlled delay elements DLY2 and DLY1 in the reset signal generating unit, are at the high level, and both of the UP signal and the DOWN signal are at the low level. When the reference clock signal and the feedback clock signal both rise to the high level (at t6a), the outputs of the NAND4 and the NAND8 go high, respectively, in response to this. Thus, the UP signal and the DOWN signal rise simultaneously (at t7a).

When the driving capability on the UP side of the dummy charge pump 17 is high, the output voltage CONT of the operational amplifier 19 becomes high. Thus, the delay time of the voltage-controlled delay element DLY1 is large, and the delay time of the voltage-controlled delay element DLY2 is small. For this reason, the output of the voltage-controlled delay element DLY2 goes low earlier, temporarily, and the one-shot-pulse reset signal is output to the NAND4 (at t8a). In response to this, the output of the NAND4 goes high, and the UP signal, which is the output of the INV3 falls. The output of the voltage-controlled delay element DLY2 recovers in a short time (at t9a). Next, after an elapse of time, the output of the voltage-controlled delay element DLY1 also goes low. The DOWN signal likewise falls (at t12a). The output of the voltage-controlled delay element DLY1 also recovers in a short time (at t13a). The output of the AND1 recovers after the outputs of both of the voltage-controlled elements DLY2 and DLY1 have been inverted, due to the functions of the voltage-controlled delay elements DLY4 and DLY3. Incidentally, the times t10a and t11a indicate times of fall and rise of the UP signal and the DOWN signal when the delay times of the voltage-controlled delay elements DLY1 and DLY2 are the same. This embodiment is an example in which the UP signal and the DOWN signal rise in response to changes in levels of the reference clock signal and the feedback clock signal, respectively, and then, after the elapses of the delay times of the voltage-controlled delay elements DLY2 and DLY1, the UP signal and the DOWN signal fall, respectively, and the pulse widths of the UP signal and the DOWN signal are thereby controlled.

As described above, in this embodiment, when the driving capability of the dummy charge pump 17 on the UP side is high, the delay times of the voltage-controlled delay elements DLY1 (and DLY3) and DLY2 (and DLY4) are adjusted based on the output voltage CONT of the operational amplifier 19 that monitors the output potential of the dummy charge pump 17. The potential VCDM at the output node of the dummy charge pump 17 of which an increase in the potential has been observed is thereby corrected as in the preceding embodiment. With this arrangement, the phase offset between the reference clock signal and the feedback clock signal caused by the high driving capabilities on the UP sides is compensated for.

Referring to FIG. 6B, when the driving capability on the DOWN side of the charge pump 12 is high, the output voltage CONT of the operational amplifier 19 decreases. Thus, the delay time of the voltage-controlled delay element DLY1 becomes small, and the delay time of the voltage-controlled delay element DLY2 becomes large. For this reason, when both of the reference clock signal and the feedback clock signal go high (at t6b), the UP signal and the DOWN signal rise simultaneously (at t7b). Next, the one-shot-pulse reset signal by which the output of the voltage-controlled delay circuit DLY1 goes low earlier is output (at t8b). In response to this, the output of the NAND8 goes high, and the output of the NAND 4 goes low. Thus, the DOWN signal, which is the output of the INV6 falls earlier. The output of the voltage-controlled delay element DLY1 recovers in a short time (t9b).

Next, the reset signal by which the output of the voltage-controlled delay element DLY2 goes low is output (at t12b). In response to this, the output of the NAND4 goes high. Thus, the UP signal, which is the output of the INV3, falls. At this point, all the inputs to the AND1 of the reset signal generating unit 20 temporarily go high, so that the reset signal disappears in a short time (at t13b). Incidentally, times t10b and t11b are the same as times t10a and t11a, respectively.

As described above, in this embodiment, when the driving capability on the DOWN side of the dummy charge pump 17 is high, the UP signal is raised earlier and its pulse width is increased, and the DOWN signal is raised later and its pulse width is reduced. A potential at the output node of the dummy charge pump 17 of which a decrease in the potential has been observed is corrected. With this arrangement, a phase offset between the reference clock signal and the feedback clock signal caused by the high driving capabilities on the DOWN sides is compensated for.

The foregoing description was given based on the preferred embodiments of the present invention. The PLL circuit of the present invention, however, is not limited to the configurations of the above embodiments. Various modifications and changes from the configurations of the above embodiments are also included in the range of the present invention.

It should be noted that other objects, features and aspects of the present invention will become apparent in the entire disclosure and that modifications may be done without departing from the gist and scope of the present invention as disclosed herein and claimed as appended herewith.

Also it should be noted that any combination of the disclosed and/or claimed elements, matters and/or items may fall under the modifications aforementioned.

What is claimed is:

1. A phase locked loop (PLL) circuit, comprising:
   a phase comparator for mutually comparing phases of a reference clock signal and a feedback clock signal input to a pair of inputs for a comparison thereof and outputting an up signal or a down signal based on a result of the comparison;
   a charge pump for causing an output voltage thereof to rise or fall based on the up signal or the down signal output by said phase comparator;
   a low-pass filter for filtering the output voltage of said charge pump; and
   a voltage-controlled oscillator for generating a clock signal dependent on an output voltage of said low-pass filter and supplying the generated clock signal to said phase comparator as the feedback clock signal; wherein said PLL circuit further comprises:
   a dummy phase comparator simulating said phase comparator, for mutually comparing phases of a predetermined clock signal input to a pair of inputs for comparison thereof connected in common and outputting an up signal or a down signal according to a result of the comparison;

a dummy charge pump simulating said charge pump, for causing an output voltage thereof to rise or fall based on the up signal or the down signal output by said dummy phase comparator; and an amplifier for detecting a difference between the output voltage of said dummy charge pump and the output voltage of said charge pump, an output voltage of said amplifier providing a signal to said phase comparator and said dummy phase comparator to control pulse widths of at least one of the up and down signals of said phase comparator and said dummy phase comparator.

2. The PLL circuit according to claim 1, wherein each of said phase comparator and said dummy phase comparator comprises voltage-controlled delay elements with delay amounts thereof controlled based on the output voltage of said amplifier, and said voltage-controlled delay elements control the pulse widths of the up signals and the down signals output by said phase comparator and said dummy phase comparator.

3. The PLL circuit according to claim 2, wherein said voltage-controlled delay elements control amounts of delay of the signals input to the pairs of the inputs for comparison to said phase comparator and said dummy phase comparator.

4. The PLL circuit according to claim 1, wherein each of said phase comparator and said dummy phase comparator comprises voltage-controlled delay elements with delay amounts thereof controlled based on the output voltage of said amplifier, and said voltage-controlled delay elements control timings of the up signals and the down signals output by said phase comparator and said dummy phase comparator.

5. The PLL circuit according to claim 4, wherein said voltage-controlled delay elements control timings of causing the up signals and the down signals to fall.

6. The PLL circuit according to claim 4, wherein said voltage-controlled delay elements control timings of causing the up signals and the down signals to rise.

7. The PLL circuit according to claim 1, wherein the predetermined clock signal comprises the reference clock signal.

8. An apparatus comprising at least one phase locked loop (PLL) circuit, wherein said PLL circuit comprises:

a phase comparator for mutually comparing phases of a reference clock signal and a feedback clock signal input to a pair of inputs for a comparison thereof and outputting an up signal or a down signal based on a result of the comparison;

a charge pump for causing an output voltage thereof to rise or fall based on the up signal or the down signal output by said phase comparator;

a low-pass filter for filtering the output voltage of said charge pump; and a voltage-controlled oscillator for generating a clock signal dependent on an output voltage of said low-pass filter and supplying the generated clock signal to said phase comparator as the feedback clock signal;

a dummy phase comparator simulating said phase comparator, for mutually comparing phases of a predetermined clock signal input to a pair of inputs for comparison thereof connected in common and outputting an up signal or a down signal according to a result of the comparison;

a dummy charge pump simulating said charge pump, for causing an output voltage thereof to rise or fall based on the up signal or the down signal output by said dummy phase comparator; and an amplifier for detecting a difference between the output voltage of said dummy charge pump and the output voltage of said charge pump, an output voltage of said amplifier providing a signal to said phase comparator and said dummy phase comparator so control pulse widths of at least one of the up and down signals of said phase comparator and said dummy phase comparator.

9. The apparatus according to claim 8, wherein each of said phase comparator and said dummy phase comparator comprises voltage-controlled delay elements with delay amounts thereof controlled based on the output voltage of said amplifier, and said voltage-controlled delay elements control the pulse widths of the up signals and the down signals output by said phase comparator and said dummy phase comparator.

10. The apparatus according to claim 9, wherein said voltage-controlled delay elements control amounts of delay of the signals input to the pairs of the inputs for comparison to said phase comparator and said dummy phase comparator.

11. The apparatus according to claim 8, wherein each of said phase comparator and said dummy phase comparator comprises voltage-controlled delay elements with delay amounts thereof controlled based on the output voltage of said amplifier, and said voltage-controlled delay elements control timings of the up signals and the down signals output by said phase comparator and said dummy phase comparator.

12. The apparatus according to claim 11, wherein said voltage-controlled delay elements control timings of causing the up signals and the down signals to fall.

13. The apparatus according to claim 11, wherein said voltage-controlled delay elements control timings of causing the up signals and the down signals to rise.

14. The apparatus according to claim 8, wherein the predetermined clock signal comprises the reference clock signal.

15. A phase locked loop (PLL) circuit, comprising:

a first phase comparator mutually comparing phases of a reference clock signal and a feedback clock signal input to a pair of inputs for a comparison thereof and outputting an up signal or a down signal based on a result of the comparison;

a first charge pump having an output voltage thereof that rises or falls based on the up signal or the down signal output by said first phase comparator;

a low-pass filter filtering the output voltage of said first charge pump;

a voltage-controlled oscillator generating a clock signal dependent on an output voltage of said low-pass filter and supplying the generated clock signal to said first phase comparator as the feedback clock signal;

a dummy phase comparator simulating said first phase comparator, mutually comparing phases of a predetermined clock signal input connected in common and outputting an up signal or a down signal according to a result of the comparison;

a dummy charge pump simulating said first charge pump and having an output voltage thereof that rises or falls, based on the up signal or the down signal output by said dummy phase comparator; and an amplifier detecting a difference between the output voltage of said dummy charge pump and the output voltage of said first charge pump, pulse widths of at least one of the up and down signals of said first phase comparator and said dummy phase comparator being controlled based on an output voltage of said amplifier, wherein each of said first phase comparator and said dummy phase comparator comprises voltage-controlled delay elements with delay amounts thereof controlled based on the output voltage of said amplifier, said voltage-controlled delay elements controlling the pulse widths of the up signals and the down signals output by said first phase comparator and said dummy phase comparator.

16. The PLL circuit according to claim 15, wherein said voltage-controlled delay elements control amounts of delay of the signals input to the pairs of the inputs for comparison to said first phase comparator and said dummy phase comparator.

17. The PLL circuit according to claim 15, wherein each of said first phase comparator and said dummy phase comparator comprises voltage-controlled delay elements with delay amounts thereof controlled based on the output voltage of said amplifier, and said voltage-controlled delay elements control timings of the up signals and the down signals output by said first phase comparator and said dummy phase comparator.

18. The PLL circuit according to claim 17, wherein said voltage-controlled delay elements control timings of causing the up signals and the down signals to fall.

19. The PLL circuit according to claim 17, wherein said voltage-controlled delay elements control timings of causing the up signals and the down signals to rise.

20. The PLL circuit according to claim 15, wherein the predetermined clock signal comprises the reference clock signal.

* * * * *